United States Patent
Chun

(10) Patent No.: US 9,508,400 B1
(45) Date of Patent: Nov. 29, 2016

(54) STORAGE DEVICE AND OPERATING METHOD THEREOF

(71) Applicant: SK hynix Inc., Gyeonggi-do (KR)

(72) Inventor: Dong Yeob Chun, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/864,252

(22) Filed: Sep. 24, 2015

(30) Foreign Application Priority Data

May 6, 2015 (KR) .......................... 10-2015-0063233

(51) Int. Cl.
| | | |
|---|---|---|
| *G11C 7/10* | (2006.01) | |
| *G11C 7/22* | (2006.01) | |
| *G11C 11/4093* | (2006.01) | |
| *G11C 11/4096* | (2006.01) | |

(52) U.S. Cl.
CPC .................. *G11C 7/10* (2013.01); *G11C 7/106* (2013.01); *G11C 7/1084* (2013.01); *G11C 7/22* (2013.01); *G11C 7/222* (2013.01); *G11C 11/4093* (2013.01); *G11C 11/4096* (2013.01)

(58) Field of Classification Search
CPC ... G11C 7/106; G11C 7/222; G11C 11/4093; G11C 7/1078; G11C 7/22; G11C 7/10; G11C 11/4096
USPC ............ 365/189.04, 189.05, 189.15, 189.16, 365/189.17, 191
See application file for complete search history.

(56) References Cited

U.S. PATENT DOCUMENTS

| | | | | |
|---|---|---|---|---|
| 2003/0037208 | A1* | 2/2003 | Matthews | G11C 7/1075 711/149 |
| 2003/0179620 | A1* | 9/2003 | Arakawa | G11C 7/1051 365/200 |
| 2005/0259479 | A1* | 11/2005 | Yamanaka | G11C 7/1012 365/189.05 |
| 2012/0213016 | A1* | 8/2012 | Iida | G06F 11/1064 365/191 |
| 2012/0281488 | A1* | 11/2012 | Jung | G11C 7/1006 365/189.17 |
| 2014/0359204 | A1* | 12/2014 | Yoo | G06F 12/0246 711/103 |
| 2015/0186042 | A1* | 7/2015 | Lee | G11C 16/32 711/103 |
| 2016/0035428 | A1* | 2/2016 | Jung | G11C 16/16 365/185.11 |
| 2016/0077579 | A1* | 3/2016 | Gulati | G06F 1/3296 713/323 |

FOREIGN PATENT DOCUMENTS

| | | |
|---|---|---|
| KR | 1020120069953 | 6/2012 |
| KR | 1020140021151 | 2/2014 |
| KR | 1020140059102 | 5/2014 |

* cited by examiner

Primary Examiner — Ly D Pham
(74) Attorney, Agent, or Firm — IP & T Group LLP

(57) ABSTRACT

A storage device includes a memory controller suitable for outputting a program command or a read command; and a memory device suitable for performing a program operation in response to the program command, and immediately performing a read operation when the read command is received during the program operation.

11 Claims, 10 Drawing Sheets

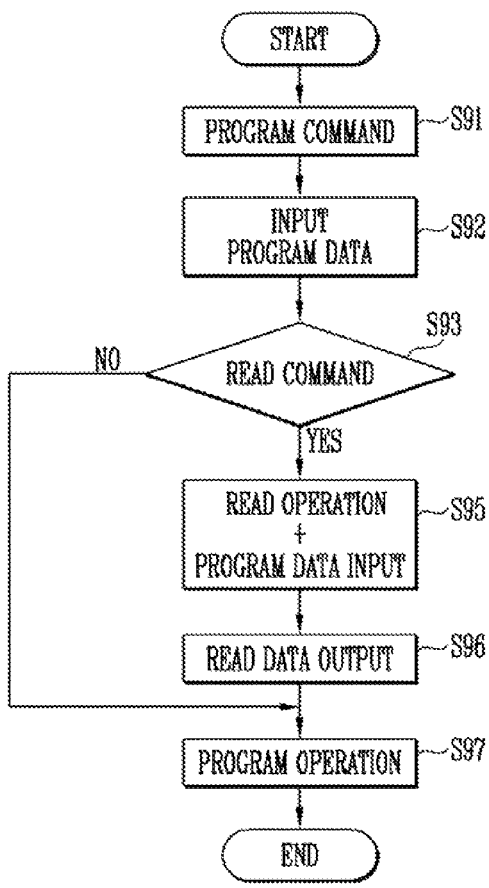
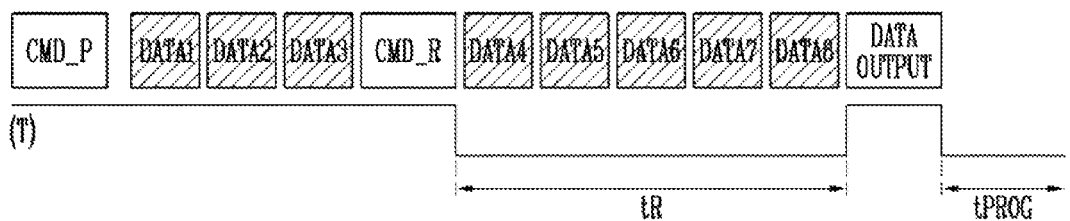

STORAGE DEVICE AND OPERATING METHOD THEREOF

CROSS-REFERENCE TO RELATED APPLICATION

The present application claims priority to Korean patent application number 10-2015-0063233, filed on May 6, 2015, the entire disclosure of which is herein incorporated by reference in its entirety.

BACKGROUND

Field of Invention

Various exemplary embodiments relate generally to a storage device and an operating method thereof, and more particularly, to a read operation and a program operation of a storage device.

Description of Related Art

A storage device includes a memory controller and a memory device. The storage device is controlled by a host. A memory system includes the host and the storage device.

The host communicates with the storage device through an interface protocol, such as peripheral component interconnect Express (PCI-E), advanced technology attachment (ATA), serial ATA (SATA), parallel ATA (PATA), serial attached SCSI (SAC), universal serial bus (USB), multimedia card (MMC), enhanced Small Disk Interface (ESDI), integrated drive electronics (IDE), and so forth.

A memory controller controls the overall operations of the storage device and exchanges commands, data and addresses between the host and the memory device.

The memory device performs program, read and/or erase operations in response to the commands, the data and the addresses provided from the memory controller.

SUMMARY

Various embodiments are directed to a storage device stopping a program operation and performing a read operation when the storage device receives a read command during the program operation.

According to an embodiment, a storage device includes a memory controller suitable for outputting a program command or a read command; and a memory device suitable for performing a program operation in response to the program command, and performing a read operation immediately when the read command is received during the program operation.

According to an embodiment, a method of operating a storage device may include inputting program data to a first latch unit in response to a program command; temporarily pausing the inputting of the program data, and transferring the program data in the first latch unit to a second latch unit immediately when a read command is received during the inputting of the program data; and performing a read operation using the first latch unit.

According to an embodiment, a method of operating a storage device may include inputting program data to a first latch unit in response to a program command; transferring the program data in the first latch unit to a second latch unit immediately when a read command is received during the inputting of the program data; and performing a read operation using the first latch unit, during the inputting of the program data to the second latch unit.

According to an embodiment, a memory device may include a peripheral circuit suitable for performing program and read operations in response to program and read commands, respectively; and a control logic suitable for controlling the peripheral circuit to be immediately responsive to the read command during the program operation.

BRIEF DESCRIPTION OF THE DRAWINGS

FIG. 9 is a flowchart illustrating an operating method according to a third embodiment;

FIG. 10 is a diagram illustrating an operating time according to a third embodiment.

DETAILED DESCRIPTION

Figure 1:
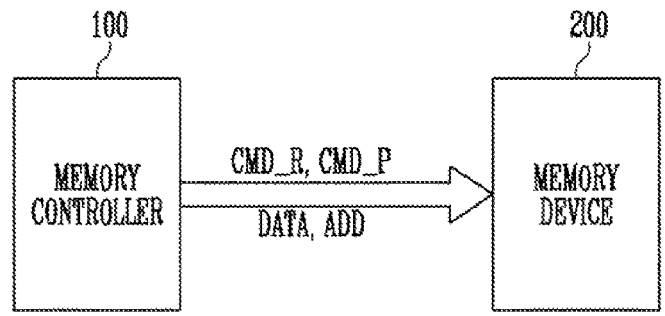
FIG. 1 is a diagram illustrating a storage device according to an embodiment.

Hereinafter, various exemplary embodiments will be described in detail with reference to the accompanying drawings. In the drawings, thicknesses and lengths of components may be exaggerated for convenience. In the following description, a detailed explanation of related functions and constitutions may be omitted for simplicity and conciseness. Like reference numerals refer to like elements throughout the specification and drawings.

FIG. 1 a diagram illustrating a storage device according to an embodiment.

Referring to FIG. 1, a storage device 1000 may include a memory controller 100 and a memory device 200.

The memory controller 100 may control overall operations of the storage device 1000, and exchange commands, data and addresses between a host and the memory device 200. For example, when the memory controller 100 receives a command for a program operation, the memory controller 100 may output a program command CMD_P, data DATA and an address ADD to the memory device 200. When the memory controller 100 receives a command for a read operation, the memory controller 100 may output a read command CMD_R to the memory device 200. Even when the memory device 200 is performing a program operation, the memory controller 100 may output the read command CMD_R to the memory device 200.

When the read command CMD_R is received during the program operation, the memory device 200 may temporarily stop performing the program operation and perform a read operation, or may perform the program operation and the read operation at the same time.

The memory device 200 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), or flash memory. A memory device 200 that uses flash memory will be used as an example, below.

Figure 2:
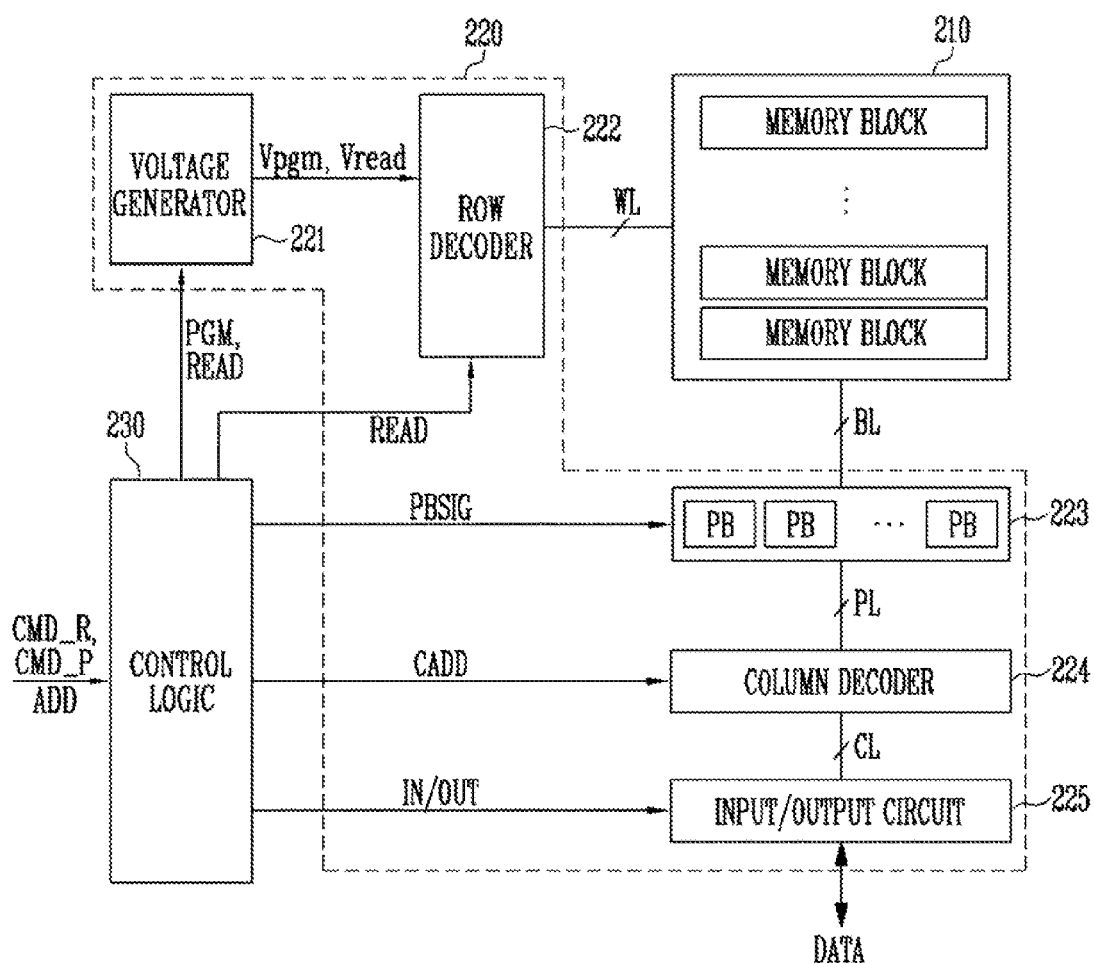
FIG. 2 is a diagram illustrating a storage device shown in FIG. 1.

FIG. 2 is a diagram illustrating the memory device shown in FIG. 1.

Referring to FIG. 2, the memory device 200 may include a memory cell array 210 in which data is stored, a peripheral circuit 220 configured to perform a program operation, a read operation or an erase operation on the memory cell array 210, and a control logic 230 configured to control the peripheral circuit 220.

The memory cell array 210 may include a plurality of memory blocks, and each of the memory blocks may include a plurality of memory cells.

The peripheral circuit 220 may include a voltage generator 221, a row decoder 222, a page buffer unit 223, a column decoder 224 and an input/output circuit 225.

The voltage generator 221 may generate a program voltage Vpgm or a read voltage. Vread in response to a program signal PGM or a read signal READ. The voltage generator 221 may also generate various other voltages for various operations.

The row decoder 222 may transfer voltages output from the voltage generator 221 to a selected memory block in response to a row address RADD. For example, the row decoder 222 may transfer the program voltage Vpgm or the read voltage Vread to word lines WL coupled to the selected memory block.

The page buffer unit 223 may include a plurality of page buffers PB. Each of the page buffers PB may be coupled to each of the bit lines BL that are coupled to the memory blocks. The page buffers PB included in the page buffer unit 223 may commonly operate in response to page buffer control signals PBSIG.

The column decoder 224 may transfer data applied through column lines CL to the page buffers PB through page lines PL in response to a column address CADD.

The input/output circuit 225 may input or output the data DATA in response to an input/output signal IN/OUT. For example, the input/output circuit 225 may transfer externally input data DATA to the column decoder 224 through the column lines CL, or externally output the data DATA provided through the column lines CL.

The control logic 230 may control the peripheral circuit 220 in response to the program command CMD_P and the address ADD, or the read command CMD_R. The control logic 230 may control the peripheral circuit 220 so that the peripheral circuit 220 may perform a read operation in response to a current read command CMD_R after all program data is input and resume program operation in response to a previous program command CMD_P after completing the read operation when the read command CMD_R is currently provided to the control logic 230 during input of program data in response to the previous program command CMD_P. Alternatively, the control logic 230 may control the peripheral circuit 220 so that the peripheral circuit 220 may temporarily stop input of the program data, perform a read operation in response to a current read command CMD_R, and then perform a program operation in response to a previous program command CMD_P after completing the read operation when the read command CMD_R is currently provided to the control logic 230 during the input of program data in response to the previous program command CMD_P. Alternatively, the control logic 230 may control the peripheral circuit 220 so that the peripheral circuit 220 may input the program data in response to a previous program command CMD_P and perform the read operation in response to a current read command CMD_R at the same time, and then perform a program operation in response to the previous program command CMD_P after completing the read operation and the input of the program data when the read command CMD_R is currently provided to the control logic 230 during the input of the program data in response to the previous program command CMD_P.

Figure 3:
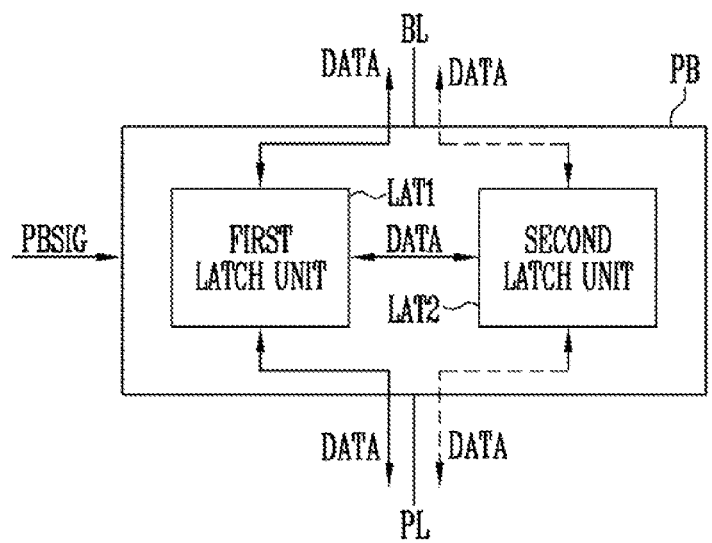
FIG. 3 is a diagram illustrating a page buffer shown in FIG. 1.

FIG. 3 is a diagram illustrating a page buffer shown in FIG. 2.

Referring to FIG. 3, since all of the page buffers PB included in the page buffer unit 223 may be the same, only one of the page buffers PB is described as an example.

The page buffer PB may include two or more latch units LAT1 and LAT2. The first latch unit LAT1 may be a main latch unit, and the second latch unit LAT2 may be a cache latch unit.

The page buffer PB in response to the page buffer signal PBSIG may input the data DATA transferred through the page line PL to one of the first and second latch units LAT1 and LAT2, or output data from one of the first and second latch units LAT1 and LAT2 to the page line PL. In addition, the page buffer PB may transfer the data between the first and second latch units LAT1 and LAT2 in response to the page buffer signal PBSIG.

A method of operating the above-described memory device when a read command is currently input during a program operation in response to a previous program command is described below.

Figure 4:
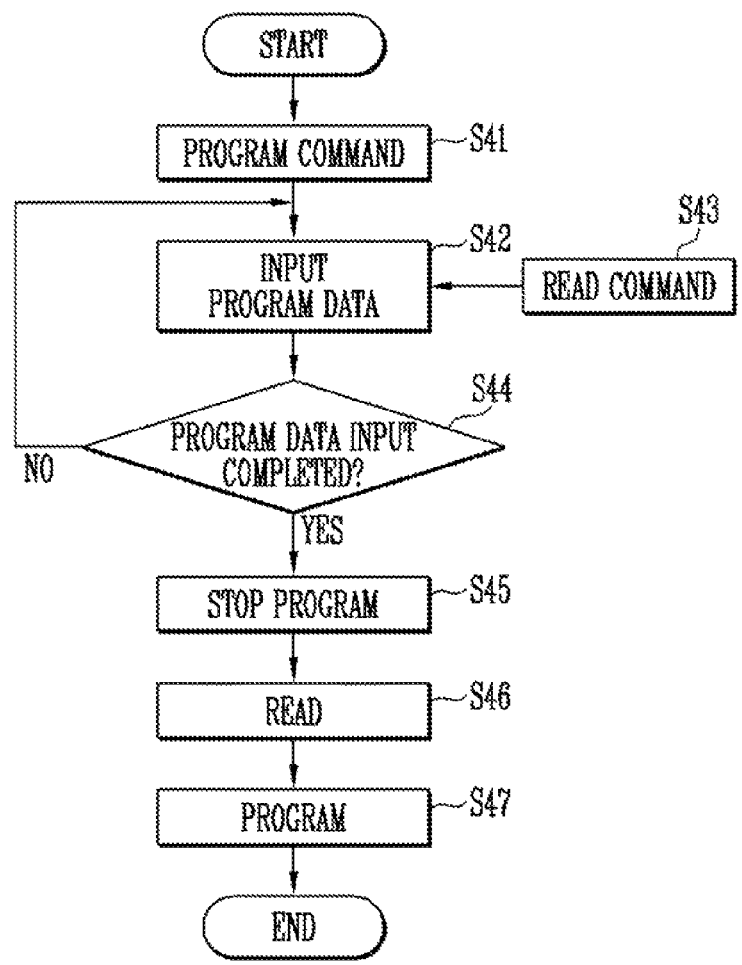
FIG. 4 is a flowchart illustrating an operating method according to a first embodiment.

FIG. 4 is a flowchart illustrating an operating method according to a first embodiment.

Referring to FIG. 4, when the control logic 230 receives the program command CMD_P at step S41, the control logic 230 may control the peripheral circuit 220 to input program data to the page buffer unit 223 at step S42.

When the control logic 230 receives the read command CMD_R at step S43 while the program data is being input in response to the program command CMD_P of step S41, the control logic 230 may suspend a read operation until all program data is input. For example, it may be determined whether the input of the program data for the program command CMD_P of step S41 is completed at step S44.

When the input of the program data is not completed as a result of determination at step S44 (NO), the control logic 230 may continue to control the peripheral circuit 220 to input program data to the page buffer unit 223.

When the input of the program data is completed as the result of determination at step S44 (YES), the control logic 230 at step S45 may control the peripheral circuit 220 to temporarily pause the program for the program command CMD_P of step S41. Subsequently at step S46, the control logic 230 may control the peripheral circuit 220 to perform the read operation on the selected memory block in response to the read command CMD_R of step S43. The read operation may include reading the selected memory block to temporarily store the read data in the page buffer unit 223, and outputting the data temporarily stored in the page buffer unit 223 through the page lines PL. When the read operation for the read command CMD_R of step S43 is completed, the control logic 230 at step S47 may control the peripheral circuit 220 to resume the paused program operation for the program command CMD_P of step S41.

Figure 5:
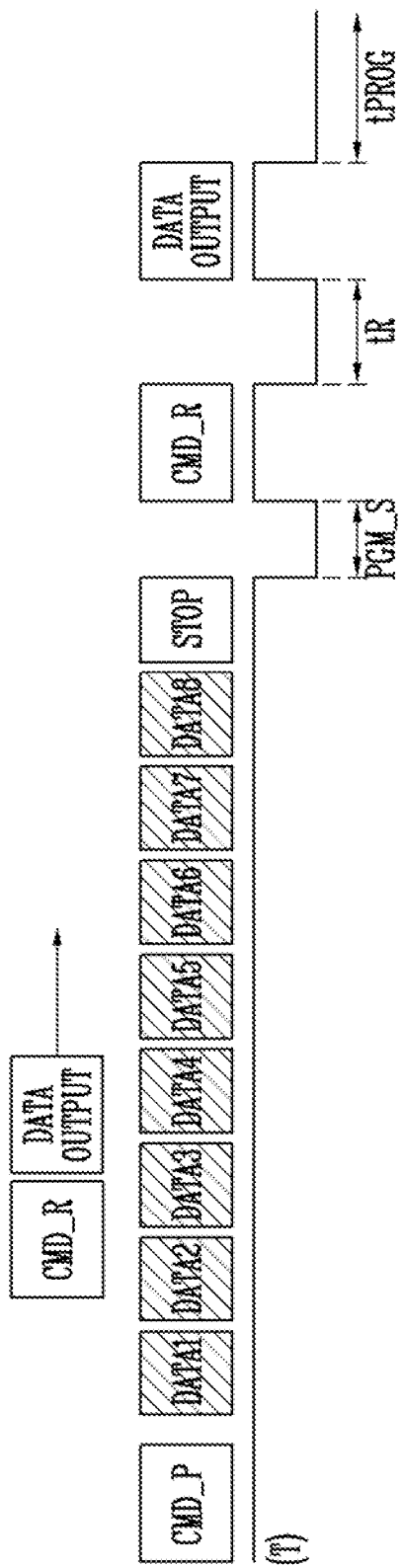
FIG. 5 is a diagram illustrating an operating time according to a first embodiment.

FIG. 5 is a diagram illustrating an operating time according to a first embodiment.

Referring to FIG. 5, program data may be input in response to the program command CMD_P. FIG. 5 exemplarily shows the program data including program data DATA1 to DATA8 which may vary according to design.

Even when the read command CMD_R is input while the program data DATA1 to DATA8 are being input, the read operation may not be performed until the input of all program data DATA1 to DATA8 is completed.

When the input of all program data DATA1 to DATA8 is completed, the program operation for the program command CMD_P may be temporarily paused. The pause may last for a first time section PGM_S. After the first time section PGM_S, voltages for a read operation may be set in response to the read command CMD_R, and the read operation of the selected memory block may be performed for a second time section tR. The read operation may include reading memory cells included in the selected memory block and inputting the read data to the page buffer unit 223.

When all data read from the selected memory block is input to the page buffer unit 223, the data of the page buffer unit 223 may be output through the page lines PL. Subsequently, the paused program operation for the program command CMD_P may be resumed. The program operation may be performed for a third time section tPROG.

According to the first embodiment, the total operating time may include a program data input time, a program pause time, a read voltage setting time, a read operating time, a read data output time and a program operating time.

In accordance with the first embodiment of the present invention, even when a read command is received while program data for a program operation is being input to the page buffer unit 223, a read operation may not be performed until all program data is input to the page buffer unit 223.

Figure 6:
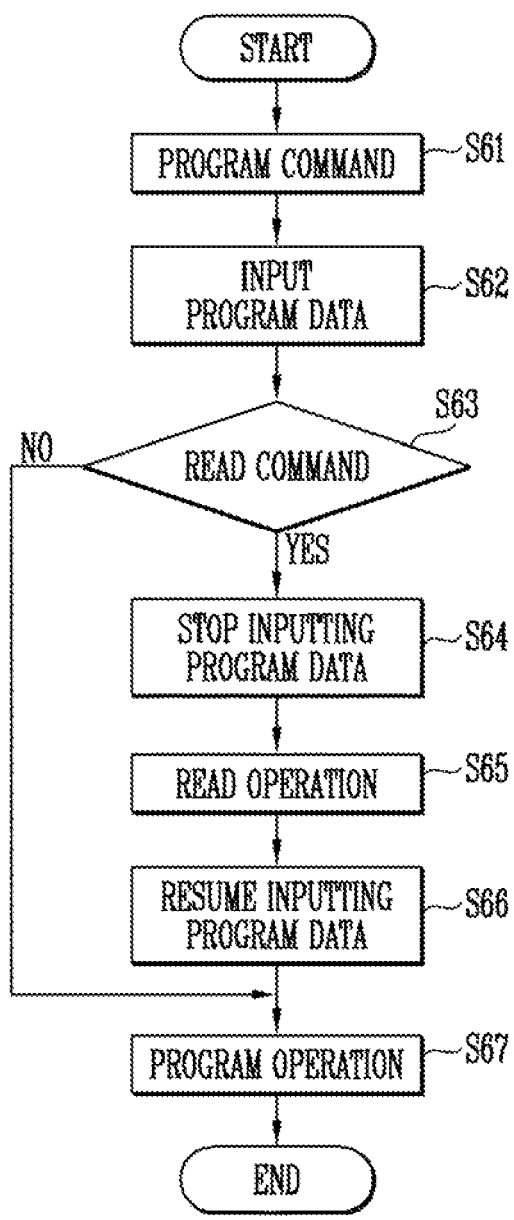
FIG. 6 is a flowchart illustrating an operating method according to a second embodiment.

FIG. 6 is a diagram illustrating an operating method according to a second embodiment.

Referring to FIG. 6, when the control logic 230 receives the program command CMD_P at step S61, the control logic 230 may control the peripheral circuit 220 to input program data to the page buffer unit 223 at step S62.

After all program data is completely input with absence of the read command CMD_R ("NO" at step S63), a program operation may be performed at step S67 in response to the program command CMD_P of step S61.

When the control logic 230 receives the read command CMD_R while the program data is being input to the page buffer unit 223 in response to the program command CMD_P of step S41 ("YES" at step S63), the input of the program data may be temporarily paused at step S64 to immediately perform a read operation at step S65 in response to the read command CMD_R of step S63 The read operation may be performed to read memory cells included in a selected page of a first memory block. The read operation may be completed after all read data input to the page buffer unit 223 is output.

Upon the completion of the read operation, the paused input of program data may be resumed at step S66, and the program data may be input to the page buffer unit 223. When all program data is input to the page buffer unit 223, the program operation of a second memory block may be performed at step S67.

The first memory block of the read operation and the second memory block of the program operation may be the same or different. Hereinafter, a description is made in reference to an example in which the first and second memory blocks are different.

Figure 7:
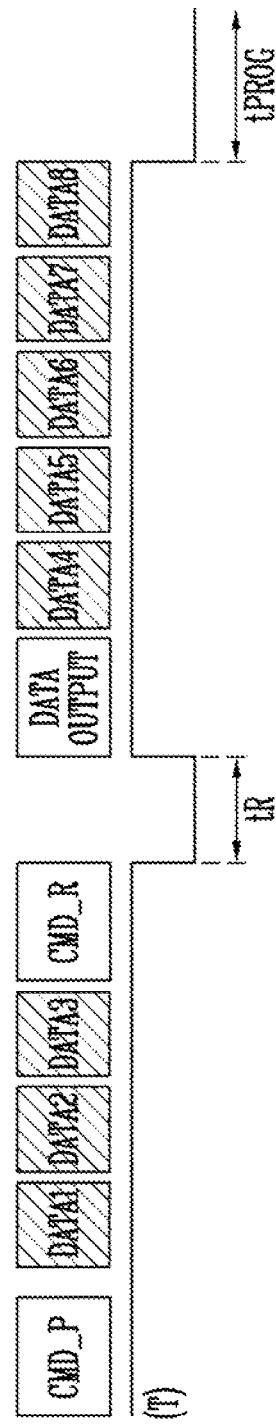
FIG. 7 is a diagram illustrating an operating time according to a second embodiment.

FIG. 7 is a diagram illustrating an operating time according to a second embodiment.

Referring to FIG. 7, program data may input in response to the program command CMD_P. FIG. 7 exemplarily shows the program data including program data DATA1 to DATA8, which may vary according to design.

When the read command CMD_R is input while the program data DATA1 to DATA8 are being input, the input of the program data may be temporarily paused, voltages for a read operation may be set in response to the read command CMD_R, and the read operation of a selected memory block may be performed for a fourth time section tR. The read operation may include reading the memory cells included in the selected memory block and inputting the read data to the page buffer unit 223.

When all data read from the selected memory block is input to the page buffer unit 223, the data of the page buffer unit 223 may be output through the page lines PL to complete the read operation.

When the read operation is completed, the paused input of the program data may be resumed. For example as shown in FIG. 7, when the read command CMD_R is received after a part DATA1 to DATA3 of the program data DATA1 to DATA8 are input to the page buffer unit 223, all the remaining data DATA4 to DATA8 may be input to the page buffer unit 223 after the read operation is completed. When all program data DATA1 to DATA8 are input, a program operation for the program command CMD_P may be performed with the input program data for a fifth time section tPROG.

According to the second embodiment, the total operating time may include a program data input time, a read voltage setting time, a read operating time, a read data output time and a program operating time.

In accordance with the second embodiment of the present invention, when a read command is received while program data for a program operation is being input to the page buffer unit 223, the program data input process may be paused, and a read operation may be performed. Therefore, the read operation may be performed before the program operation.

FIGS. 8A to 8F are diagrams illustrating data transfer according to the second embodiment.

Figure 8A:
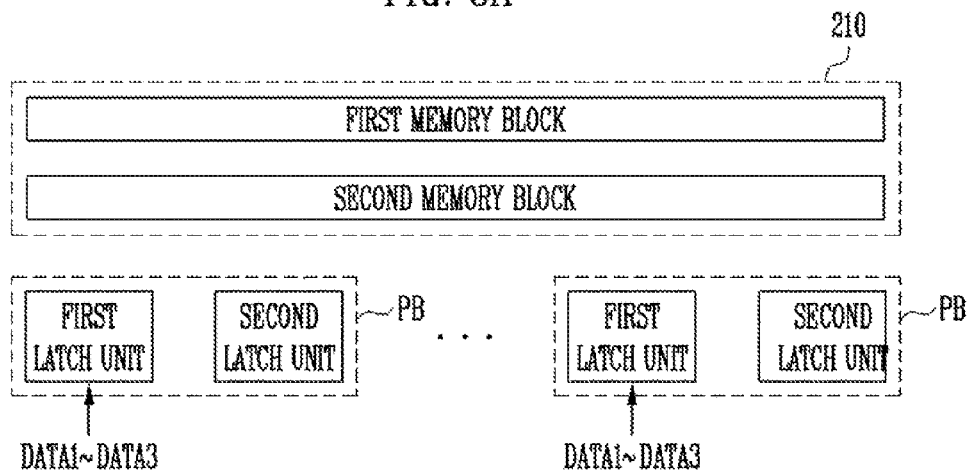
FIGS. 8A to 8F are diagrams illustrating data transfer according to a second embodiment.

Referring to FIG. 8A, a memory cell array 210 may include a plurality of memory blocks. For example, the first memory block may be selected for the read operation, and the second memory block may be selected for the program operation. In response to the program command CMD_P, the program data DATA1 to DATA3 may be sequentially input to the first latch unit LAT1 of the page buffer PB (see step S62 of FIG. 6).

Figure 8B:
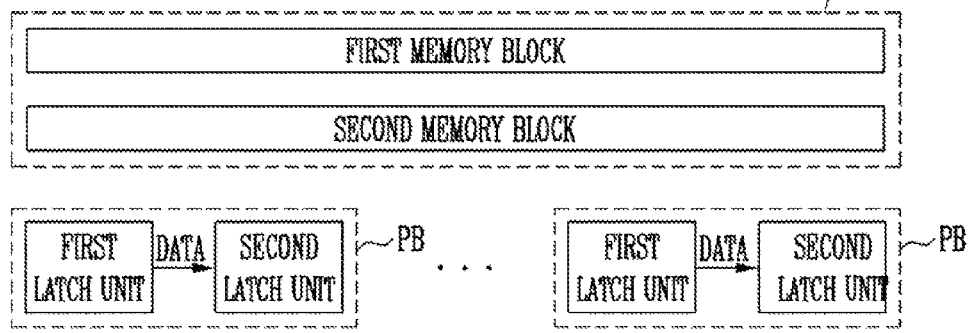

Referring to FIG. 8B, the input of the program data may be paused according to the interrupted input read command CMD_R (see step S63 of FIG. 6), and the data DATA1 to DATA3 of the first latch unit LAT1 may be transferred to the second latch unit LAT2.

Figure 8C:
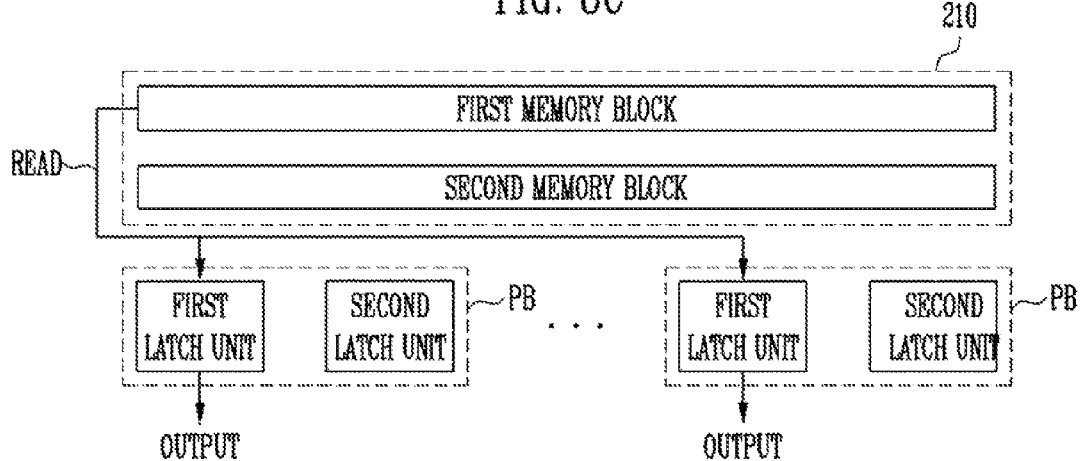

Referring to FIG. 8C, the read operation CMD_R may be performed to the first memory block selected for the read operation. The read data may be output via the first latch unit LAT1. When all read data is output via the first latch unit LAT1, the read operation may be completed.

Figure 8D:
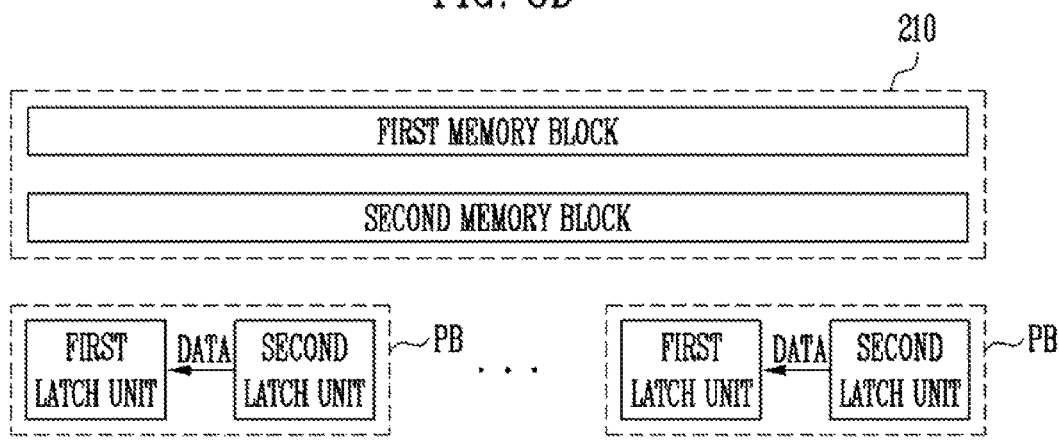

Referring to FIG. 8D, when the read operation is completed, the data DATA1 to DATA3 temporarily transferred to the second latch unit LAT2 may be transferred back to the first latch unit LAT1.

Figure 8E:
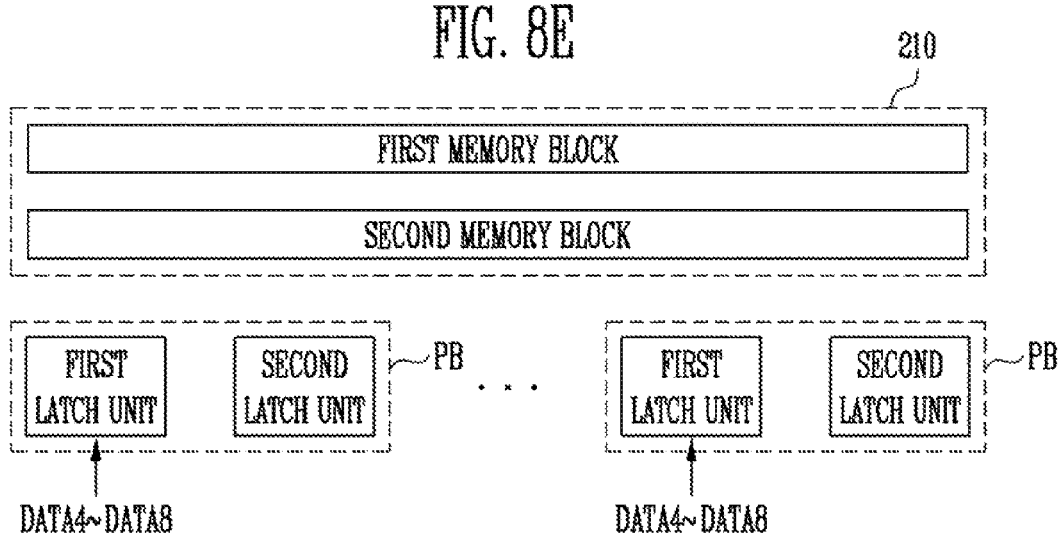

Referring to FIG. 8E, the paused input of the program data may be resumed, so that the remaining program data DATA4 to DATA8 may be input to the first latch unit LAT1.

Figure 8F:
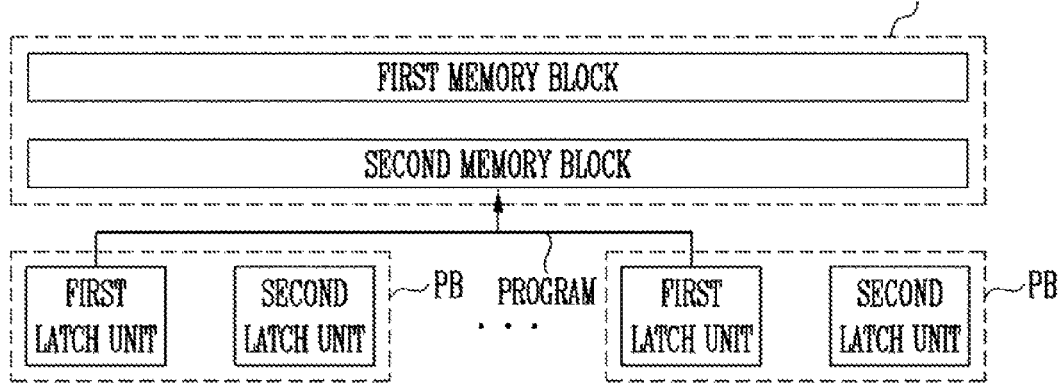

Referring to FIG. 8F, when all program data is input to the first latch unit, the program operation may be performed to the second memory block with the program data DATA1 to DATA8 of the first latch unit.

FIG. 9 is a flowchart illustrating an operating method according to a third embodiment.

Referring to FIG. 9, when the control logic 230 receives the program command CMD_P at step S91, the control logic 230 may control the peripheral circuit 220 to input program data to the page buffer unit 223 at step S92.

After all program data is completely input with absence of the read command CMD_R ("NO" at step S93), a program operation may be performed at step S97 in response to the program command CMD_P of step S91.

When the control logic 230 receives the read command CMD_R while the program data is being input to the page buffer unit 223 in response to the program command CMD_P of step S91 ("YES" at step S93), both of a read operation for the read command CMD_R and the input of the program data for the program command CMD_P may be concurrently performed at step S95, which may reduce the total operating time. The read operation performed at step S95 may include reading selected memory cells and inputting the read data to the page buffer unit 223. After completion of both of the read command CMD_R and the input of the program data for the program command CMD_P, the read data of the page buffer unit 223 may be output at step S96, and a program operation of the selected memory block may be performed with the program data of the page buffer unit 223 at step S97.

FIG. 10 is a diagram illustrating an operating time according to a third embodiment.

Referring to FIG. 10, program data may be input in response to the program command CMD_P. FIG. 10 exemplarily shows the program data including program data DATA1 to DATA8, which may vary according to design.

When the read command CMD_R is input while the program data DATA1 to DATA8 are being input, voltages for a read operation may be set in response to the read command CMD_R, and the read operation of the selected memory block may be performed for a sixth time section tR with continuation of the input of the program data. The read operation performed for the sixth time section tR may include sensing data from selected memory cells. The program data, for example DATA4 to DATA8 shown in FIG. 10 may be input to the page buffer unit 223 during the read operation, or for the sixth time section tR.

When all the data read from the selected memory block is input to the page buffer unit 223, the read data may be output through the page lines PL, thereby completing the read operation.

Upon completion of the read operation, a program operation may be performed for a seventh time section tPROG in response to the program command CMD_P with the program data of the page buffer unit 223.

As described above, according to the third embodiment, the total operating time may include a program data input time, a read voltage setting time, a read data output time and a program operating time.

In accordance with the third embodiment of the present invention, when a read command is received while program data for a program operation is being input to the page buffer unit 223, both of the program data input process and the read operation may be concurrently performed so that the read operation may be performed before the program operation, and the operating time may be reduced.

FIGS. 11A to 11F are diagrams illustrating data transfer according to the third embodiment.

Figure 11A:
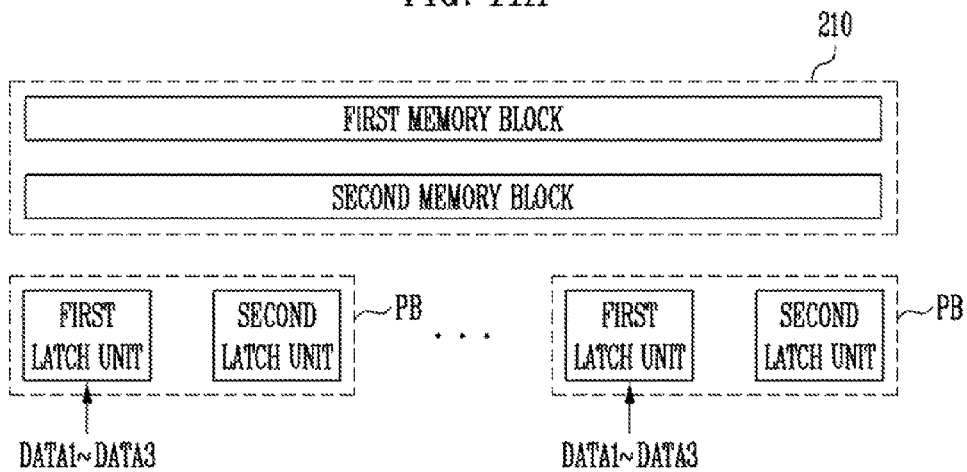
FIGS. 11A to 11F are diagrams illustrating data transfer according to a third embodiment.

Referring to FIG. 11A, the memory cell array 210 may include a plurality of memory blocks. For example, the first memory block may be selected for the read operation, and the second memory block may be selected for the program operation. In response to the program command CMD_P, the program data DATA1 to DATA3 may be sequentially input to the first latch unit LAT1 of the page buffer PB (see step S92 of FIG. 9).

Figure 11B:
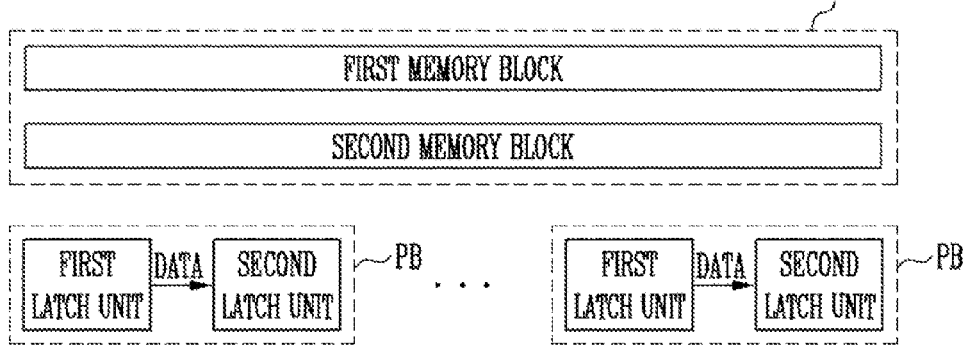

Referring to FIG. 11B, the input of the program data may be paused according to the interrupted input read command CMD_R (see step S93 of FIG. 9), and the data DATA1 to DATA3 of the first latch unit LAT1 may be transferred to the second latch unit LAT2.

Figure 11C:
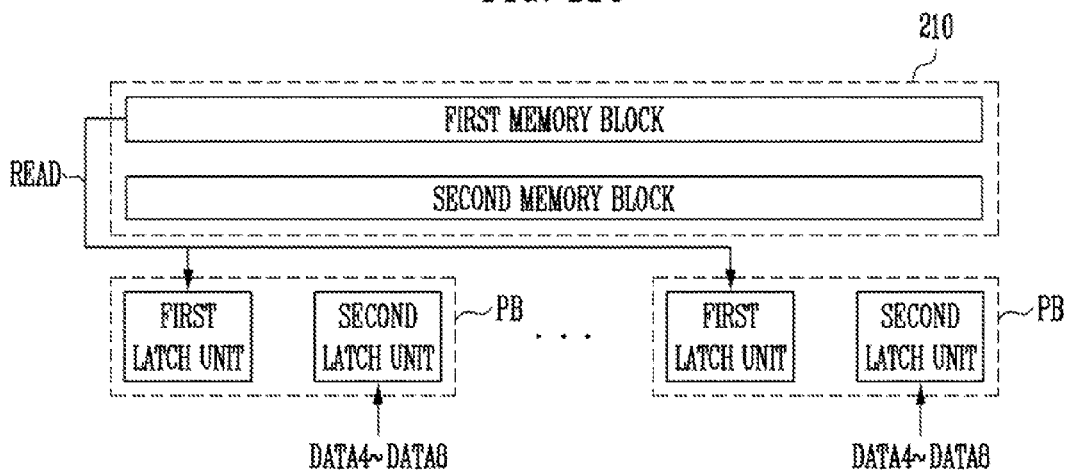

Referring to FIG. 11C, the read operation CMD_R may be performed to the first memory block selected for the read operation. The read data may be input to the first latch unit LAT1. Concurrently, the program data DATA4 to DATA8 may be input to the second latch unit LAT2. Therefore, all program data DATA1 to DATA8 may be input to the second latch unit LAT2 without pause of the input of the program data even while the read operation is performed in response to the interrupted input read command CMD_R.

Figure 11D:
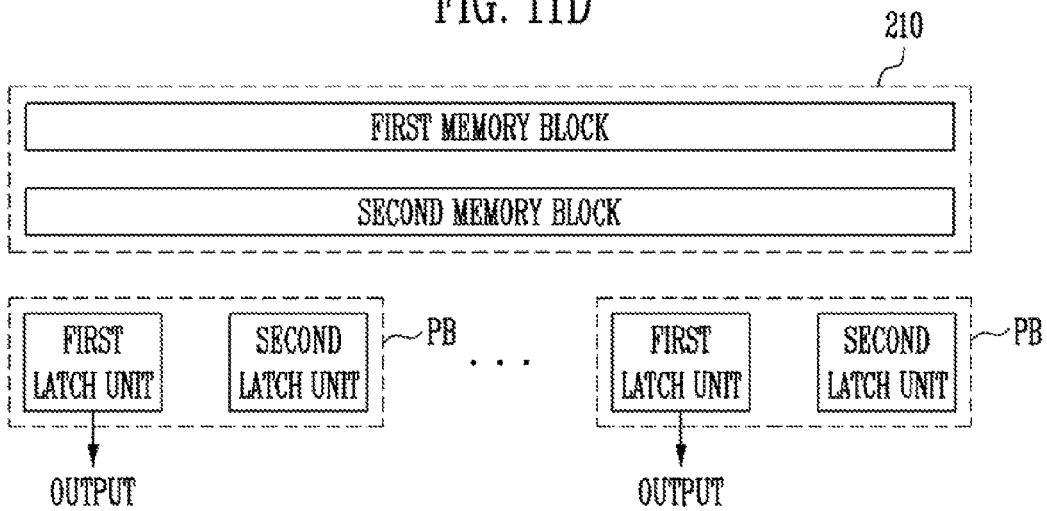

Referring to FIG. 11D, when all read data is input to the first latch unit LAT1 and the program data DATA4 to DATA8 are input to the second latch unit LAT2, the read data of the first latch unit LAT1 may be output, thereby completing the read operation.

Figure 11E:
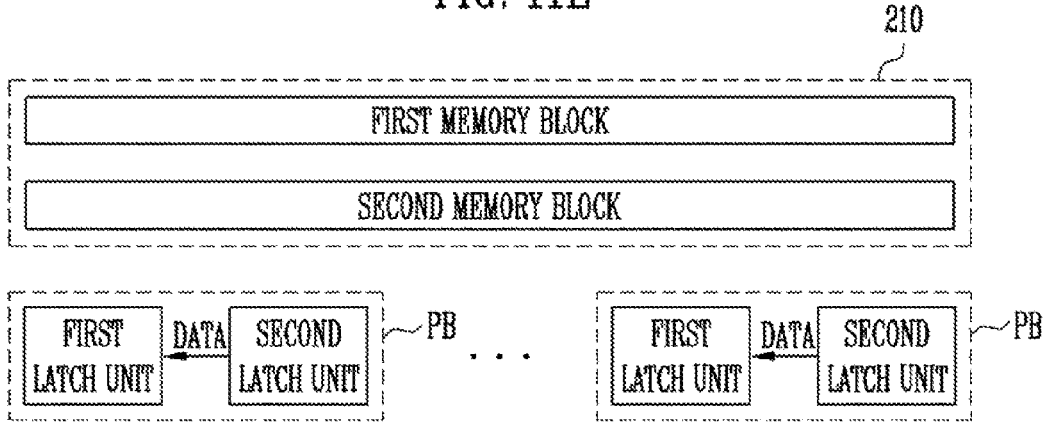

Referring to FIG. 11E, upon the completion of the read operation, all of the program data DATA1 to DATA8 of the second latch unit LAT2 may be transferred to the first latch unit LAT1.

Figure 11F:
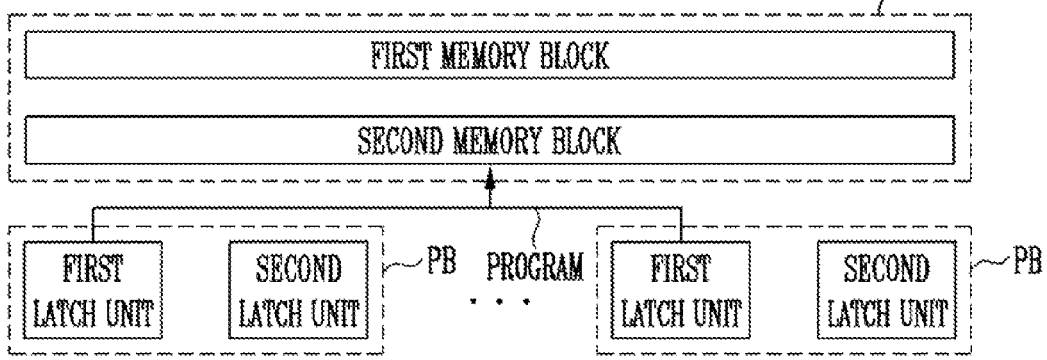

Referring to FIG. 11F, when the all program data is transferred to the first latch unit LAT1, a program operation may be performed to the second memory block with the program data of the first latch unit LAT1.

According to various embodiments of the present invention, when a memory device receives a read command during a program operation, the memory device may immediately perform a read operation, so that the operating time required for the read operation and the program operation may be reduced to improve performance of a storage device including the memory device.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A storage device, comprising:
   a memory controller configured to output a program command or a read command; and
   a memory device configured to input program data to a first latch unit in response to the program command, temporarily pause the input of the program data, and transfer the program data in the first latch unit to a second latch unit immediately when the read command is received during the input of the program data, perform a read operation using the first latch unit, transfer the program data back from the second latch unit to the first latch unit upon completion of the read operation, resume the input of the program data to the first latch unit, and perform a program operation with the program data in the first latch unit.

2. The storage device of claim 1, wherein the memory device comprises:
   a plurality of memory blocks;
   a peripheral circuit configured to perform the program operation or the read operation on the plurality of memory blocks; and a control logic configured to control the peripheral circuit to perform the program operation in response to the program command, and to perform the read operation immediately when the read command is received during the program operation.

3. The storage device of claim 2, wherein the peripheral circuit comprises:
a voltage generator configured to generate program and read voltages in response to program and read signals, respectively;
a row decoder configured to transfer the program and read voltages to the memory blocks;
a plurality of page buffers configured to buffer data;
an interfacing unit configured to transfer the data between the page buffers and an external device.

4. The storage device of claim 3, wherein each of the page buffers includes the first and second latch units.

5. The storage device of claim 4,
wherein the first and second latch units and the interfacing unit are coupled through page lines, and
wherein the memory blocks and the page buffers are coupled through bit lines.

6. The storage device of claim 4, wherein the first and second latch units exchange the data with one another.

7. The storage device of claim 4, wherein each of the first and second latch units receives the data provided from the interfacing unit.

8. A method of operating a storage device, the method comprising:
inputting program data to a first latch unit in response to a program command;
temporarily pausing the inputting of the program data, and transferring the program data in the first latch unit to a second latch unit immediately when a read command is received during the inputting of the program data;
inputting read data from memory blocks to the first latch unit;
externally outputting the read data in the first latch unit;
transferring the program data in the second latch unit to the first latch unit;
resuming the inputting of the program data to the first latch unit; and
performing a program operation with the program data in the first latch unit.

9. A method of operating a storage device, the method comprising:
inputting program data to a first latch unit in response to a program command;
transferring the program data stored in the first latch unit to a second latch unit immediately when a read command is received during the inputting of the program data,
performing a read operation using the first latch unit, and inputting the program data to the second latch unit during the read operation,
transferring the program data back from the second latch unit to the first latch unit upon completion of the read operation and the inputting of the program data, and
performing a program operation with the program data stored in the first latch unit.

10. The method of claim 9, further comprising outputting the read data in the first latch unit when all read data is input to the first latch unit and all program data is input to the second latch unit.

11. A storage device, comprising:
a memory controller configured to output a program command or a read command; and
a memory device configured to input program data to a first latch unit in response to the program command, transfer the program data stored in the first latch unit to a second latch unit immediately when a read command is received during the input of the program data, perform a read operation using the first latch unit and input the program data to the second latch unit during the read operation, transfer the program data back from the second latch unit to the first latch unit upon completion of the read operation and the input of the program data, and perform the program operation with the program data in the first latch unit.

* * * * *